United States Patent
Jung et al.

(10) Patent No.: US 9,989,842 B2
(45) Date of Patent: Jun. 5, 2018

(54) METHOD OF GENERATING TEST PATTERNS USING RANDOM FUNCTION

(71) Applicant: SAMSUNG ELECTRONICS CO., LTD., Suwon-si, Gyeonggi-do (KR)

(72) Inventors: Jeeeun Jung, Yongin-si (KR); Jeonghoon Lee, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 71 days.

(21) Appl. No.: 15/058,300

(22) Filed: Mar. 2, 2016

(65) Prior Publication Data
US 2017/0017748 A1    Jan. 19, 2017

(30) Foreign Application Priority Data
Jul. 14, 2015    (KR) .................... 10-2015-0099921

(51) Int. Cl.
*G06F 17/50* (2006.01)
*G03F 1/36* (2012.01)
*G03F 1/44* (2012.01)

(52) U.S. Cl.
CPC . *G03F 1/36* (2013.01); *G03F 1/44* (2013.01)

(58) Field of Classification Search
CPC .......... G03F 1/36; G03F 1/44; G06F 17/5081; H01L 21/0274; H01L 22/12; H01L 22/30
See application file for complete search history.

(56) References Cited

U.S. PATENT DOCUMENTS

| | | | |
|---|---|---|---|
| 2006/0160001 A1* | 7/2006 | Wang | G03F 1/84 430/30 |
| 2007/0051950 A1 | 3/2007 | Kobayashi et al. | |
| 2009/0142675 A1 | 6/2009 | Kim | |

FOREIGN PATENT DOCUMENTS

| KR | 10-2005-0064768 A | 6/2005 |
|---|---|---|
| KR | 10-2005-0070768 A | 7/2005 |
| KR | 10-0662961 B1 | 12/2006 |
| KR | 10-0734658 B1 | 6/2007 |
| KR | 10-2009-0057735 A | 6/2009 |

\* cited by examiner

*Primary Examiner* — Vuthe Siek
(74) *Attorney, Agent, or Firm* — Lee & Morse, P.C.

(57) ABSTRACT

Provided is a method of generating test patterns. The method includes generating a first polygon, disposing the first polygon in a pattern region, selecting one region from peripheral regions of the first polygon, generating a second polygon, disposing the second polygon in the selected region, and repeating the above processes.

20 Claims, 18 Drawing Sheets

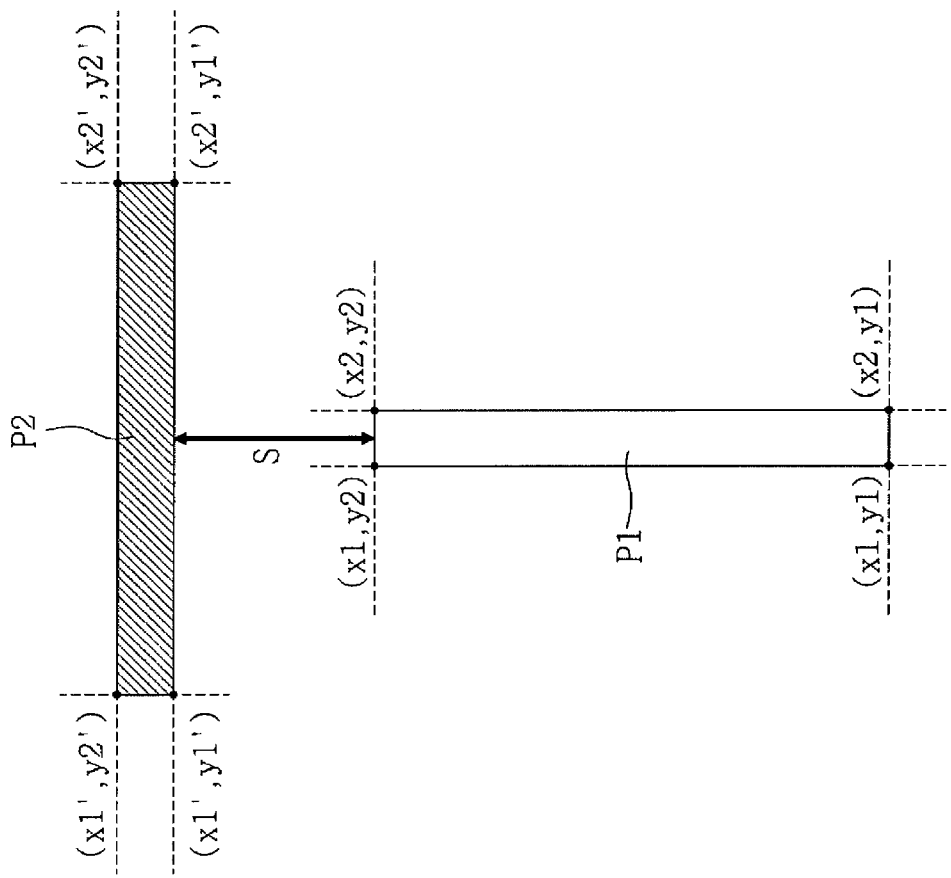

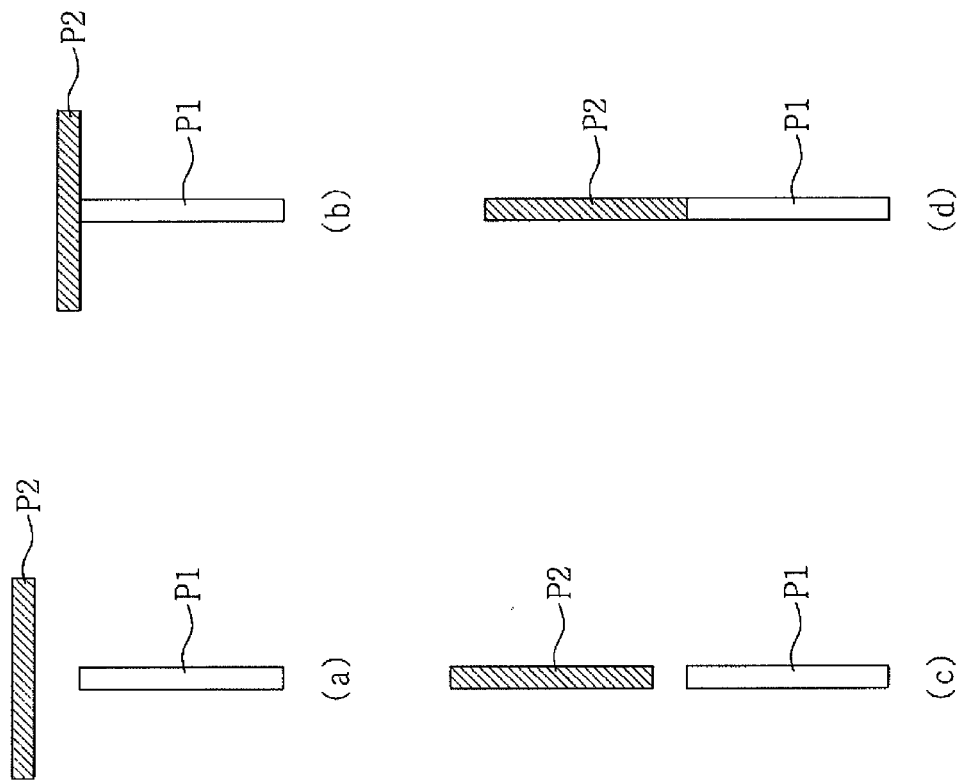

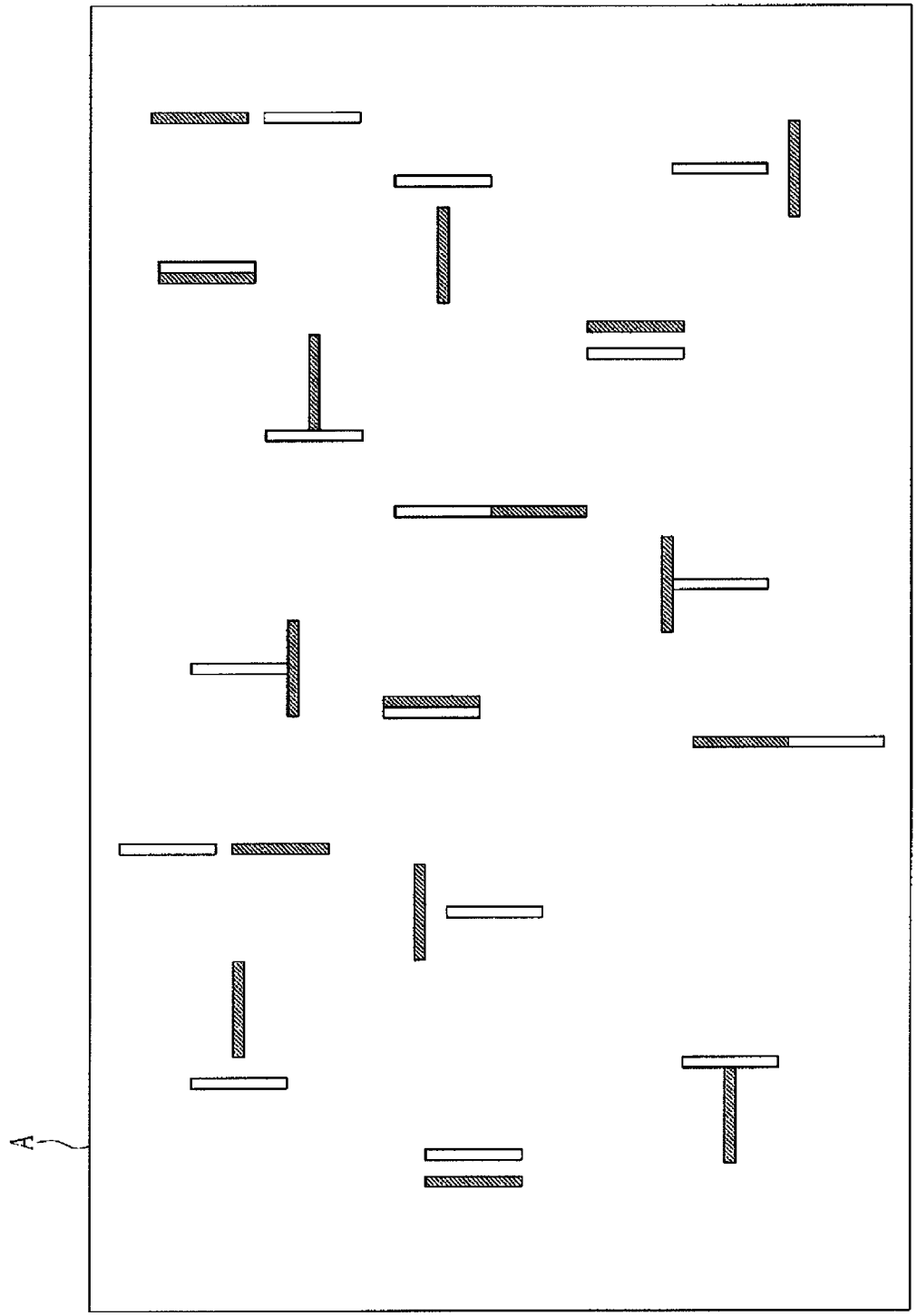

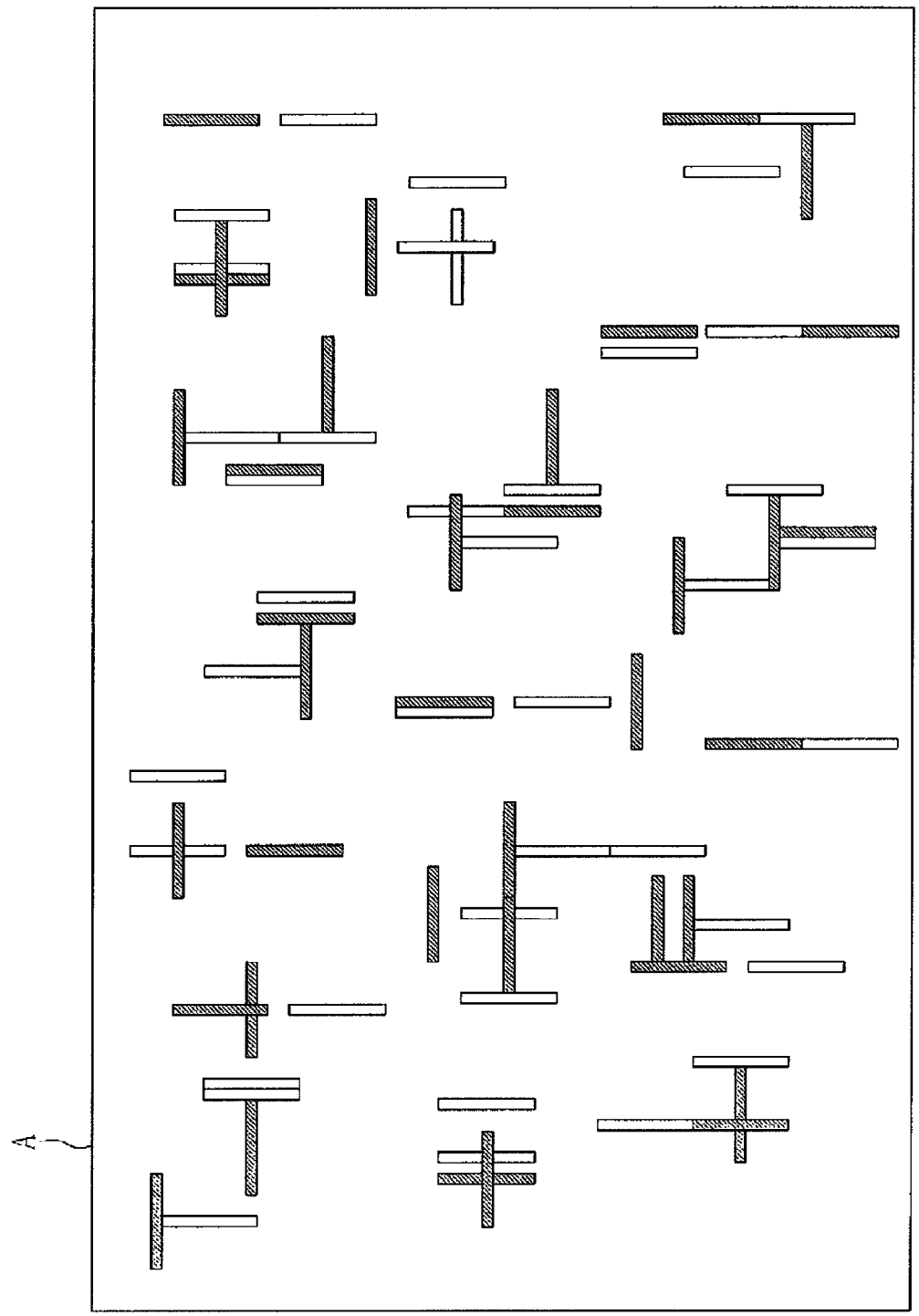

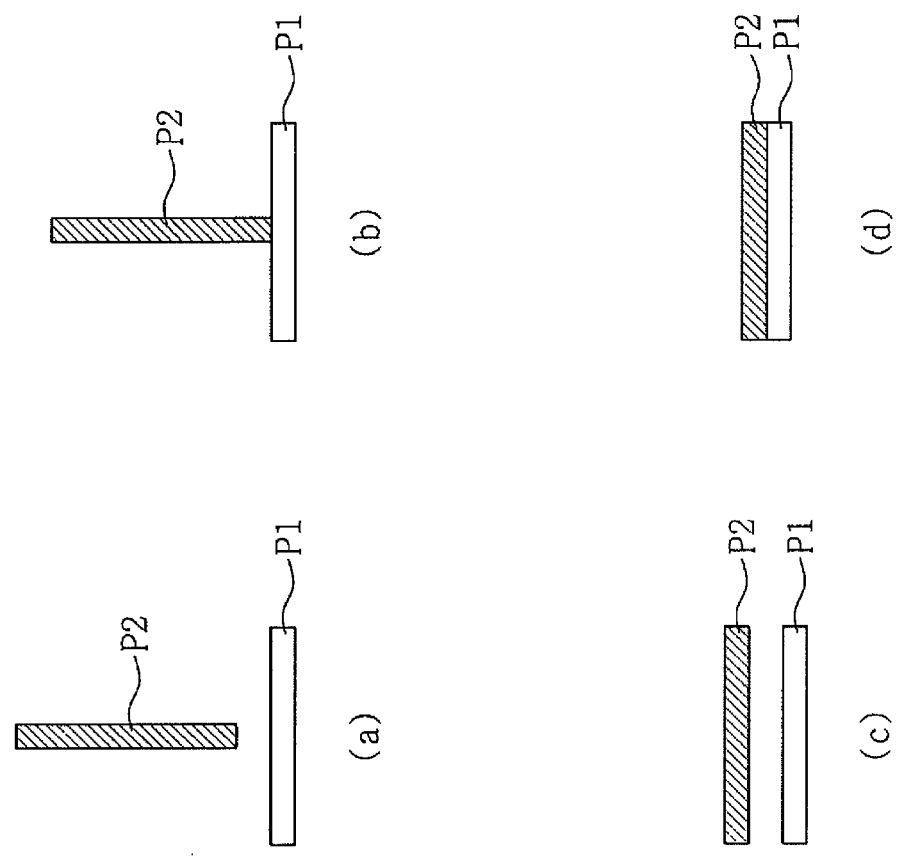

METHOD OF GENERATING TEST PATTERNS USING RANDOM FUNCTION

CROSS-REFERENCE TO RELATED APPLICATION

Korean Patent Application No. 10-2015-0099921, filed on Jul. 14, 2015, in the Korean Intellectual Property Office, and entitled: "Method of Generating Test Patterns Using Random Function," is incorporated by reference herein in its entirety.

BACKGROUND

1. Field

Embodiments relate to a method of generating test patterns, and more particularly, to a method of generating test patterns having various combinations of polygons randomly disposed using a random function.

2. Description of the Related Art

Circuit patterns of semiconductor devices are formed through a photolithography process using a photomask. In the photolithography process, as optical patterns are miniaturized, therefore, a method of correcting an optical proximity effect, a pattern coloring method using a dual patterning process, or the like has been proposed. In order to verify the validity of the method, e.g., to verify the validity of the method of correcting the optical proximity effect, line-and-space type patterns having a one-dimensional (1D) form or mesh type patterns having a two-dimensional (2D) form are being used as test patterns. However, since the circuit patterns used in the semiconductor devices are substantially very diverse and complex, test patterns having various shapes are needed in order to obtain more precise test results.

SUMMARY

Embodiments provide test patterns having polygon combinations having various shapes.

Other embodiments provide a method of generating test patterns having polygon combinations having various shapes.

In accordance with an aspect of embodiments, a method of generating test patterns includes generating a first polygon, disposing the first polygon in a pattern region, selecting one region from peripheral regions of the first polygon, generating a second polygon, disposing the second polygon in the selected region, and repeating the above processes.

The first polygon and the second polygon may each have a vertical or horizontal bar shape having a rectangular shape.

The first polygon and the second polygon may have the same size.

The first polygon may be disposed in the pattern region using a random coordinate function.

The peripheral region of the first polygon may be one of a top region, a bottom region, a left region, and a right region of the first polygon.

The second polygon may be disposed in the selected region in a vertical bar shape or a horizontal bar shape using a random direction function.

The first polygon and the second polygon may be disposed within a set space.

The first polygon and the second polygon may be merged or separated through a random setting method.

The method may further include checking a space between the first polygon and the second polygon, and removing at least one of the first polygon and the second polygon when the space between the first polygon and the second polygon is smaller than a set minimum space.

The first polygons and the second polygons generated by the repeating may be allowed to intersect or overlap.

In accordance with another aspect of embodiments, a method of generating test patterns includes generating a first polygon, disposing the first polygon in a pattern region, randomly selecting one region from a top region, a bottom region, a left region, and a right region of the first polygon, generating a second polygon, disposing the second polygon in the selected region, checking a space between the first polygon and the second polygon, determining the first polygon and the second polygon as normal pass patterns when the space is greater than a set minimum space, and repeating the above processes.

The generating of each of the first polygon and the second polygon may include selecting any one of a vertical bar shape and a horizontal bar shape using a random direction function.

The first polygon may be disposed at determined coordinates, and the second polygon may be randomly disposed in the region selected using a random position function in one shape of a vertical bar shape and a horizontal bar shape selected using a random direction function.

The method may further include determining the first polygon and the second polygon as fail patterns when the checked space between the first polygon and the second polygon is smaller than the set minimum space, and removing the first polygon and the second polygon.

The first polygon and the second polygon may be allowed to intersect or partially overlap.

In accordance with another aspect of embodiments, a method of generating test patterns includes generating a first polygon, disposing the first polygon in a pattern region, selecting one region from peripheral regions of the first polygon, generating a second polygon, disposing the second polygon in the selected region, such that the first and second polygons define at least a part of a composite of one test pattern of the test patterns, and repeating generation and disposition of the first and second polygons.

Disposing the second polygon in the selected region may be within a predetermined range with respect to the first polygon.

Disposing the second polygon in the selected region may be such that the first and second polygons are at non-oblique angles with respect to each other.

Selecting the one region from the peripheral regions may be performed with a random function.

Disposing the second polygon in the selected region may be random with respect to an angle between the first and second polygons.

BRIEF DESCRIPTION OF THE DRAWINGS

Features will become apparent to those of ordinary skill in the art by describing in detail exemplary embodiments with reference to the attached drawings, in which:

FIGS. 2-7, 8A-8D, 9, and 10 illustrate conceptual views of a method of generating test patterns in accordance with an embodiment;

FIGS. 11A to 11D illustrate views of various generated combinations of polygons in accordance with an embodiment.

DETAILED DESCRIPTION

Figure 1:
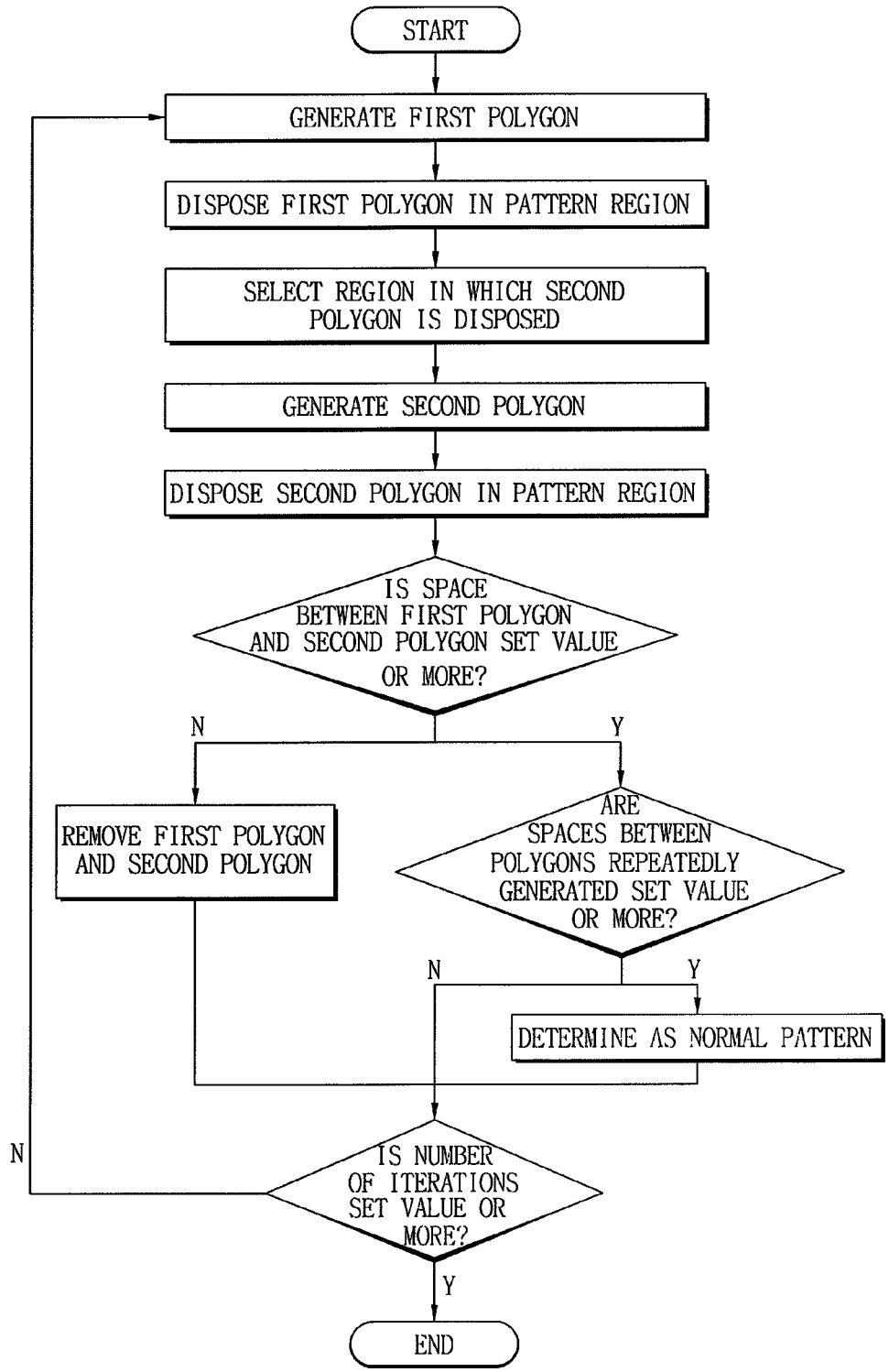
FIG. 1 illustrates a flowchart of a method of generating test patterns in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

FIG. 1 is a flowchart for describing a method of generating test patterns in accordance with an embodiment. FIGS. 2 to 10 are conceptual views for describing the method of generating test patterns in accordance with an embodiment. Each of the test patterns illustrated in FIGS. 2 to 10 may be any one of a photoresist pattern and an optical material pattern on a computer monitor, a photomask layout, or a wafer.

According to embodiments, each test pattern may be a composite of a plurality of polygons, e.g., at least two polygons. The plurality of polygons in each test pattern may be randomly arranged into a complex shape, as will be described in more detail below with reference to FIGS. 1-10.

Figure 2:
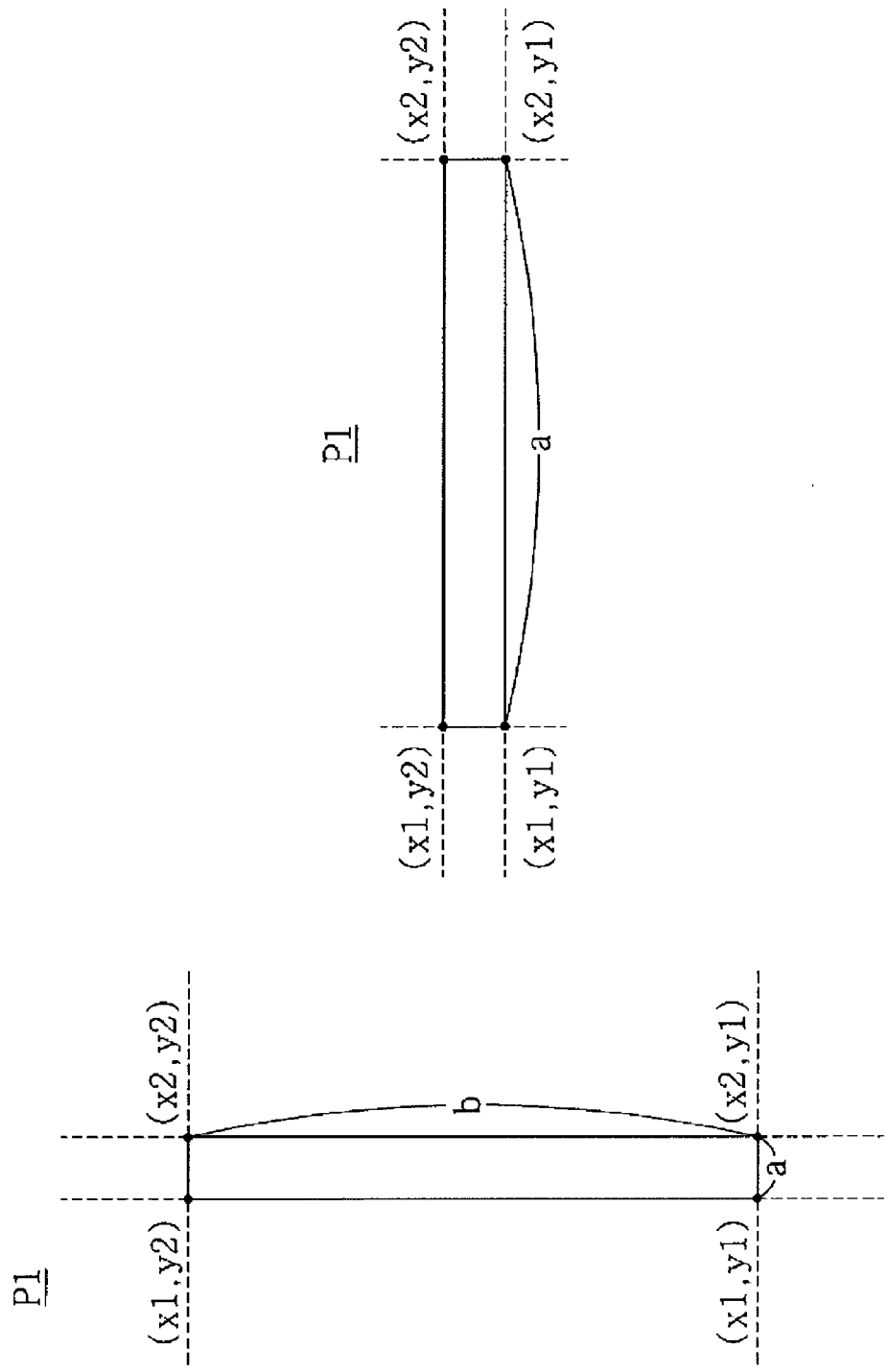

Referring to FIGS. 1 and 2, the method of generating the test patterns in accordance with an embodiment may include setting a number of iterations, and generating a first polygon P1 of the plurality of polygons. The number of iterations may be set greater than a number of required test patterns. The number of iterations will be described in more detail below.

The first polygon P1 may have a vertical or horizontal bar shape having a rectangular shape. When the first polygon P1 has the rectangular shape, the first polygon P1 may have vertexes located at four pairs of coordinates (x1, y1), (x1, y2), (x2, y1), and (x2, y2). For example, the first polygon P1 may be displayed on a computer program using two pairs of first coordinates (x1, y1) and second coordinates (x2, y2). The second coordinates (x2, y2) may have a form in which specific values are added to the first coordinates (x1, y1). For example, the first polygon P1 may be displayed using the first coordinates (x1, y1), and the second coordinates (x1+a, y1+b) (where a and b are constants determined by a designer).

Figure 3:
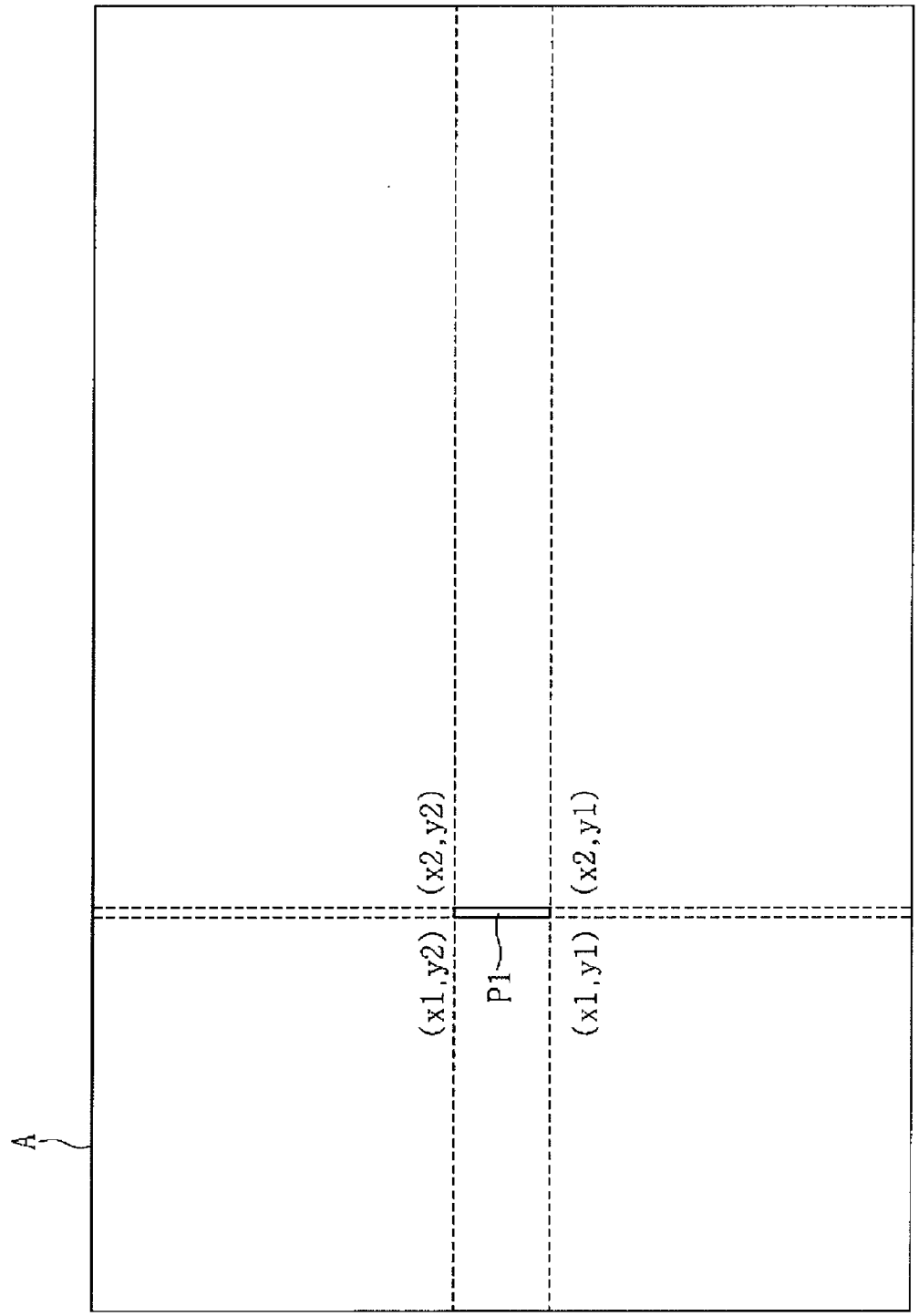

Referring to FIGS. 1 and 3, after generating the first polygon P1, the method may include disposing the first polygon P1 in a pattern region A. For example, the first polygon P1 may be disposed at a random position in the pattern region A using a random coordinate function, e.g., the first coordinates (x1, y1) and second coordinates (x2, y2) of the first polygon P1 may be randomly matched with four coordinates in the pattern region A (FIG. 3). In the embodiment, it will be assumed that the first polygon P1 has a vertical bar shape, where the first polygon P1 may have a short width of an equation of x2−x1=a, and a long width of an equation of y2−y1=b (left side of FIG. 2).

Figure 4:
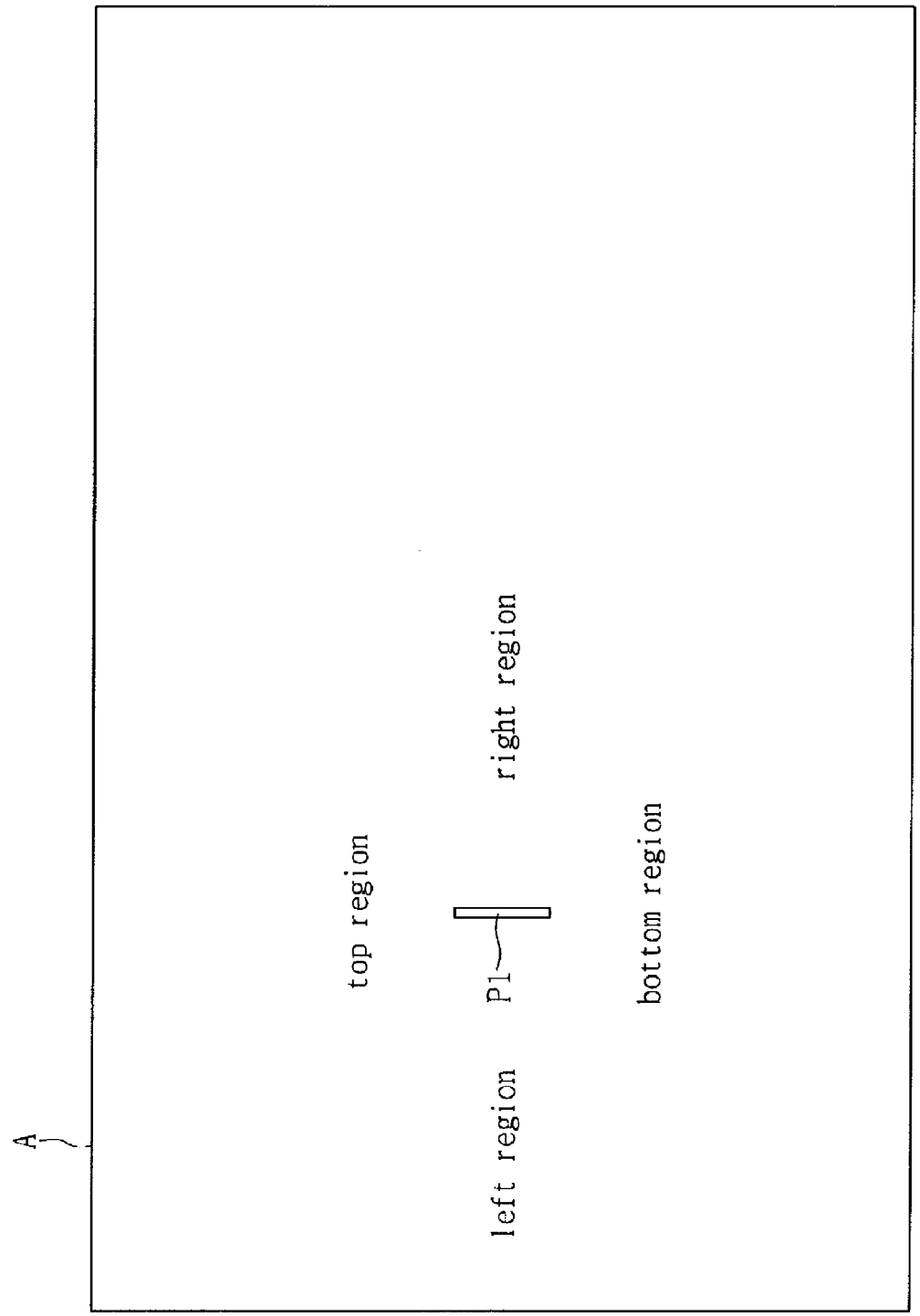

Next, referring to FIGS. 1 and 4, the method may include selecting or determining one region from peripheral regions of the first polygon P1 using a random position function. For example, if the peripheral regions of the first polygon P1 includes a top region relative to the first polygon P1, a bottom region relative to the first polygon P1, a left region relative to the first polygon P1, and a right region relative to the first polygon P1, the random position function may randomly select one of the top, bottom, left, and right regions. The randomly selected region may accommodate an additional polygon, as will be discussed in more detail below with reference to FIGS. 5-6.

Figure 5:
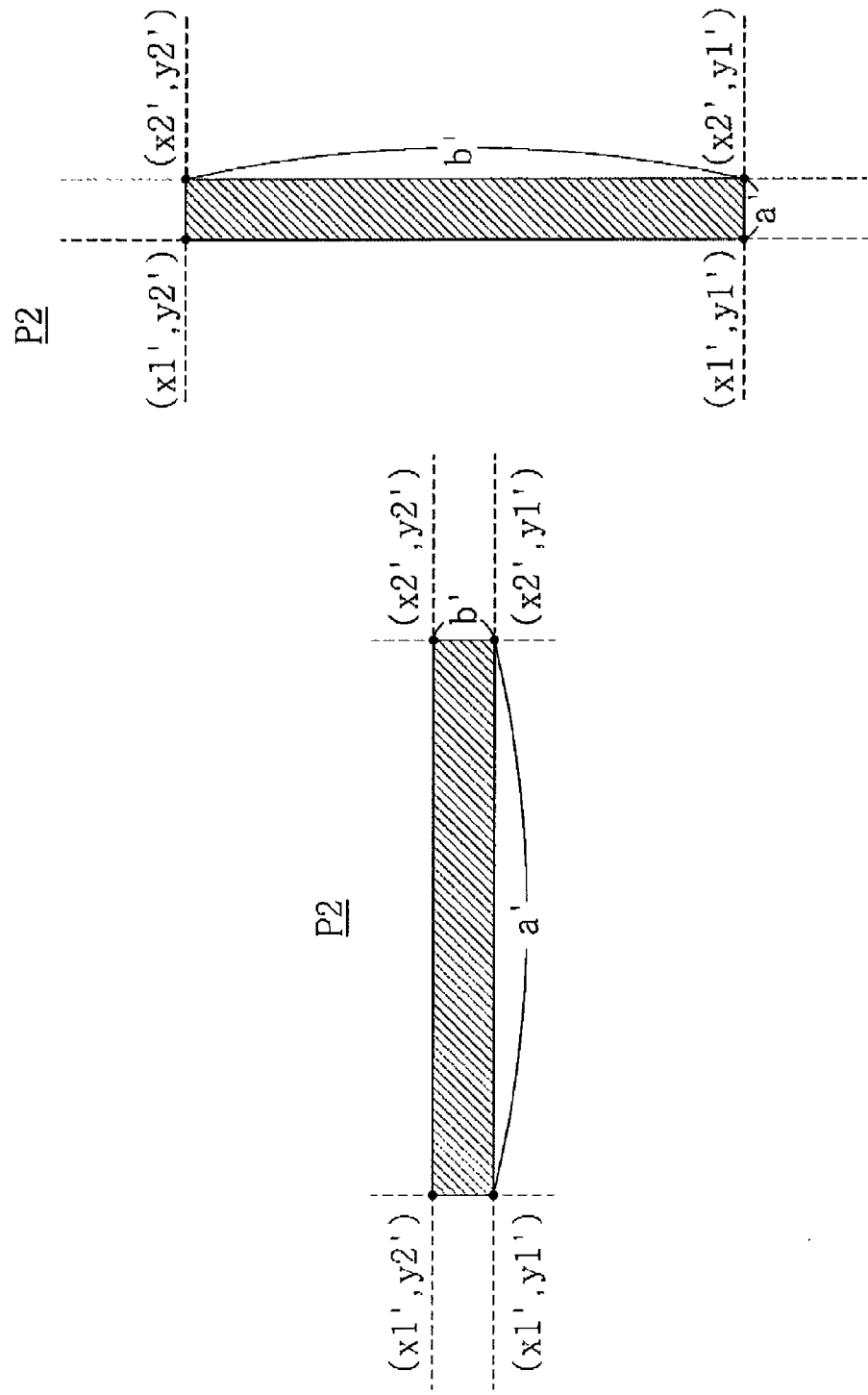

Next, referring to FIGS. 1 and 5, the method may include generating the additional polygon, e.g., a second polygon P2. The second polygon P2 may also have a vertical or horizontal bar shape having a rectangular shape. The second polygon P2 may be generated in any one direction selected from a vertical direction and a horizontal direction using a random direction function. Therefore, the second polygon P2 may be randomly selected to have one shape of the vertical bar shape and the horizontal bar shape. As an example, it will be assumed that the second polygon P2 is selected and generated so as to have the horizontal bar shape. Therefore, the second polygon P2 may have vertexes located at four pairs of coordinates (x1', y1'), (x1', y2'), (x2', y1'), and (x2', y2'). The second polygon P2 may be displayed on a computer program using two pairs of coordinates of first coordinates (x1', y1') and second coordinates (x2', y2'). The second coordinates (x2', y2') may also have a form in which specific values are added to the first coordinates (x1', y1') with reference to the first polygon P1. For example, the second polygon P2 may have a long width of an equation of x2'−x1'=a', and a short width of an equation of y2'''y1'=b'. For convenience, it will be assumed that a shape and size of the second polygon P2 are the same as those of the first polygon P1 (a=b' and b=a'). It will further be assumed that additional polygons to be described below have the same shape and size. Therefore, for example, when all the polygons have the same shape and size, generation of the second polygon P2 may be replaced by randomly selecting whether the second polygon P2 to be additionally disposed has the vertical bar shape or the horizontal bar shape.

Figure 6:
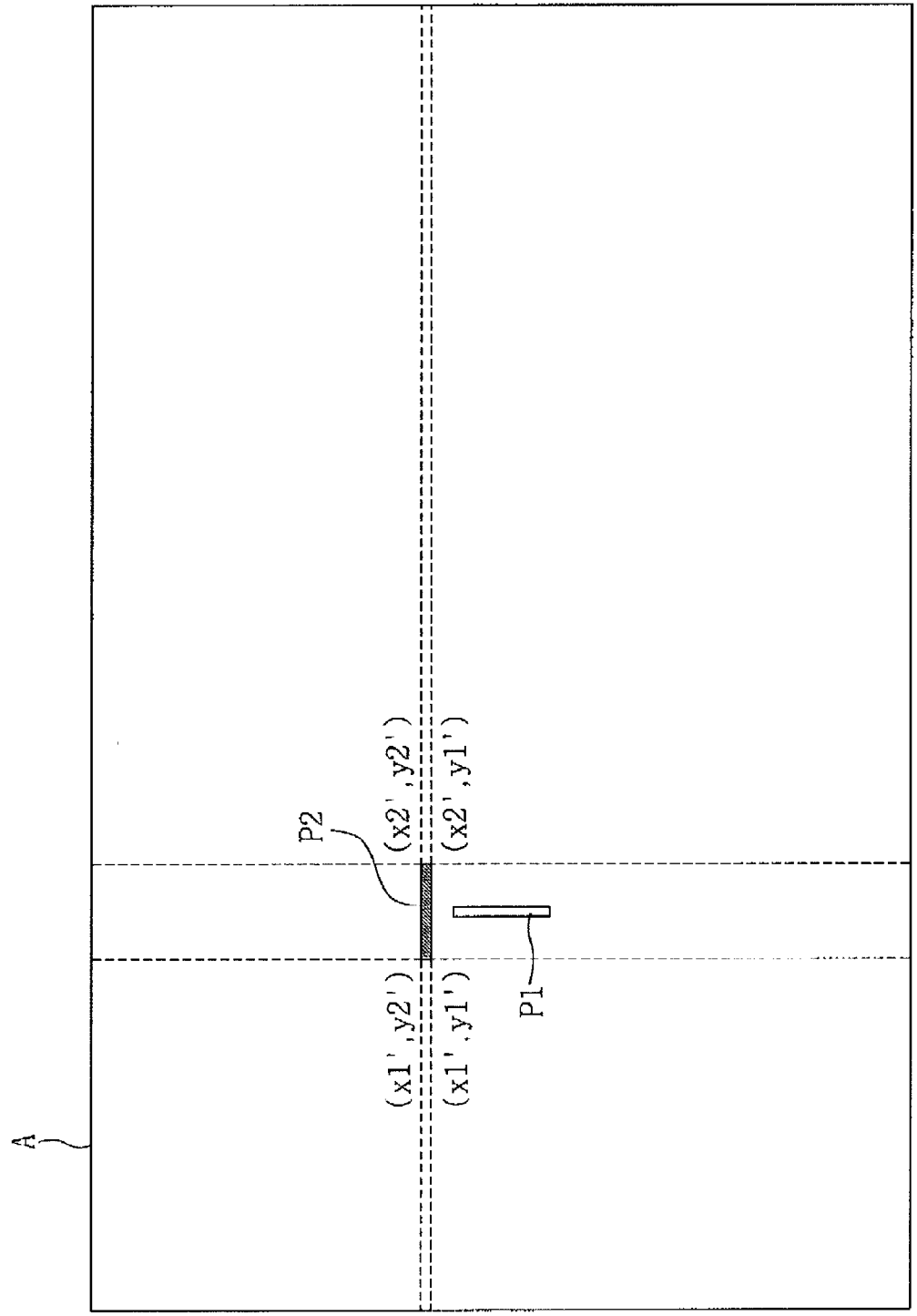

Next, referring to FIGS. 1 and 6, the method may include randomly disposing the additional polygon, e.g., the second polygon P2, at a position selected using a random function in the pattern region A. That is, the second polygon P2 may be disposed in the randomly selected region relatively to the first polygon P1, i.e., in the randomly selected region discussed previously with reference to FIG. 4, so the selected region for the second polygon P2 may be any one of the top region, the bottom region, the left region, and the right region of the first polygon P1, e.g., the first and second polygons P1 and P2 may be oriented at a non-oblique angle with respect to each other. For example, as illustrated in FIG. 6, the second polygon P2 may be disposed in the top region of the first polygon P1.

A limit coordinate range may be set so that the second polygon P2 is disposed within a set space with respect to the first polygon P1. For example, the second polygon P2 may be disposed so that a difference between a coordinate x1 of the first polygon P1 and a coordinate x1' of the second polygon P2 and a difference between a coordinate y1 of the first polygon P1 and a coordinate y1' of the second polygon P2 are predetermined limits or less (e.g., $x1-x \leq x1' \leq x1+x$ and $y1-y \leq y1' \leq y1+y$, where x and y are constants).

The method may further include selecting whether the first polygon P1 and the second polygon P2 are merged, e.g., united or in contact with each other, or separated, e.g., split apart from each other, using a random function before the second polygon P2 is disposed. For example, any one of the coordinate x1' and the coordinate y1' of the second polygon P2 may be determined. Specifically, when the second polygon P2 is selected to be disposed in the left region or the right region of the first polygon P1, the coordinate x1' of the second polygon P2 may be determined and the coordinate y1' thereof may be randomly selected within a predetermined range. When the second polygon P2 is selected to be disposed in the top region or the bottom region of the first polygon P1, the coordinate y1' of the second polygon P2 may be determined and the coordinate x1' thereof may be randomly selected within a predetermined range. In the embodiment, as an example, it is assumed that the first polygon P1 and the second polygon P2 are separated.

Next, referring to FIGS. 1 and 7, the method may include checking a space S between the first polygon P1 and the second polygon P2. For example, the method may include checking a shortest space between edges or vertexes of the first polygon P1 and edges or vertexes of the second polygon P2. In other words, the method may include checking spaces between long axes or short axes of the first polygon P1 and long axes or short axes of the second polygon P2. In the computer programming, the long axis may be referred to as a side and the short axis may be referred to as a tip.

In detail, the method may include comparing at least one of the coordinates x1, x2, y1, and y2 of the first polygon P1 to at least one of the coordinates x1', x2', y1', and y2' of the second polygon P2. In the embodiment, since the second polygon P2 is disposed in the top region of the first polygon P1, the method may include comparing the coordinate y1' of the second polygon P2 to the coordinate y2 of the first polygon P1, i.e., calculate the difference y1'-y2. The method may include classifying the first polygon P1 and the second polygon P2 into pass patterns and determining the first polygon P1 and the second polygon P2 as normal test patterns when the space S between the first polygon P1 and the second polygon P2 is greater than a minimum space by the design rule, so patterns based on the normal-determined first and second polygons P1 and P2 may be formed. Further, the method may include classifying the first polygon P1 and the second polygon P2 into fail patterns when the space S is smaller than the minimum space, followed by removing the failed first polygon P1 and the second polygon P2.

Figure 8B:
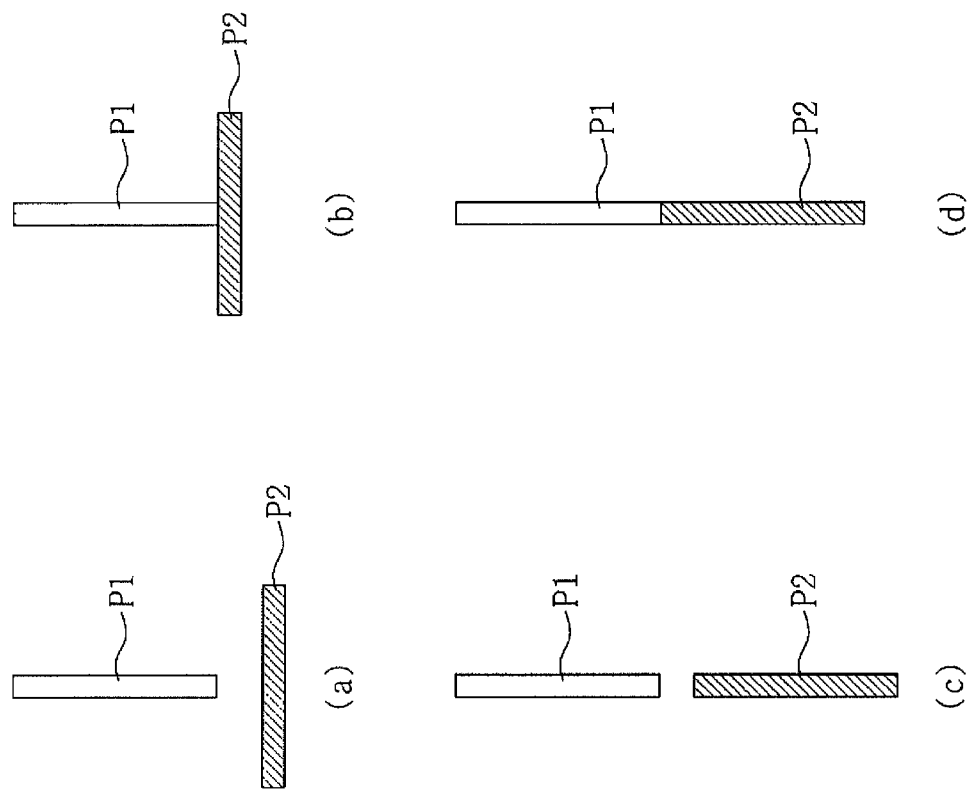
Figure 8C:
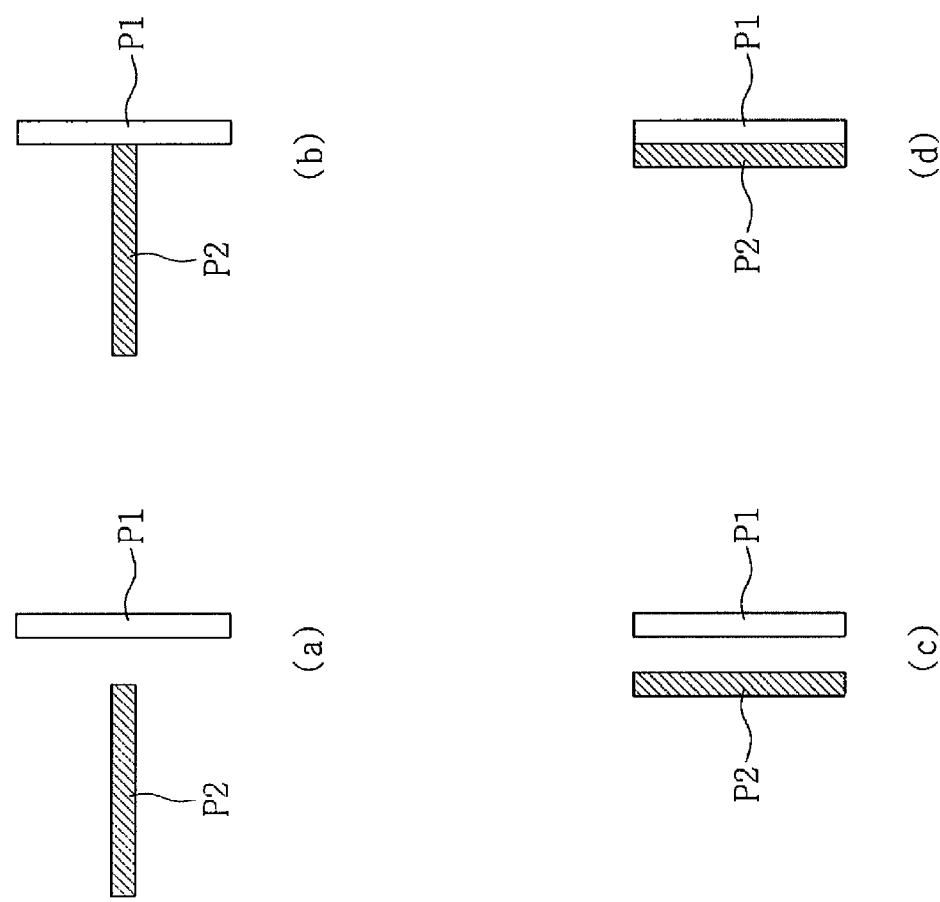
Figure 8D:
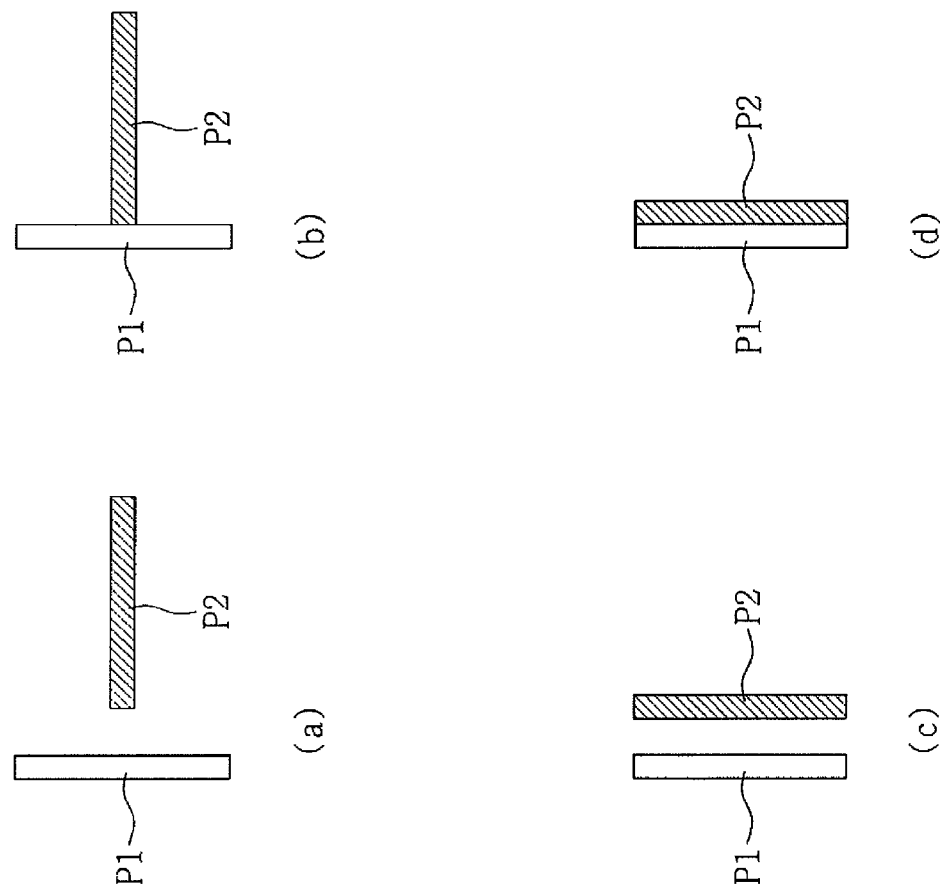
Figure 11B:
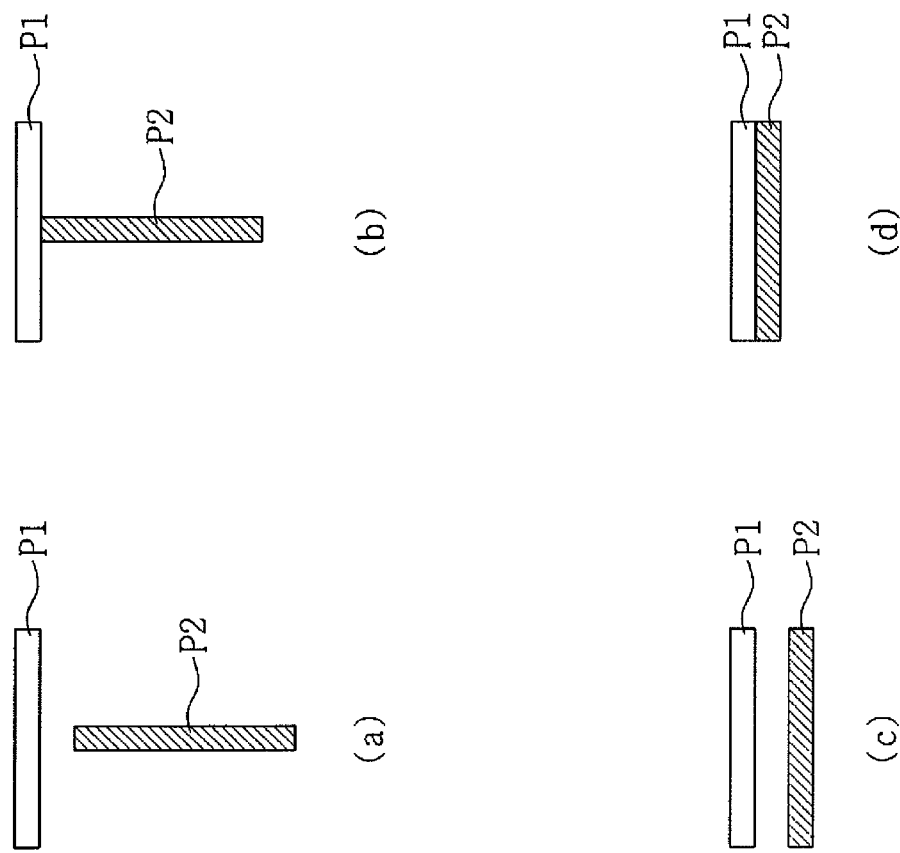
Figure 11C:
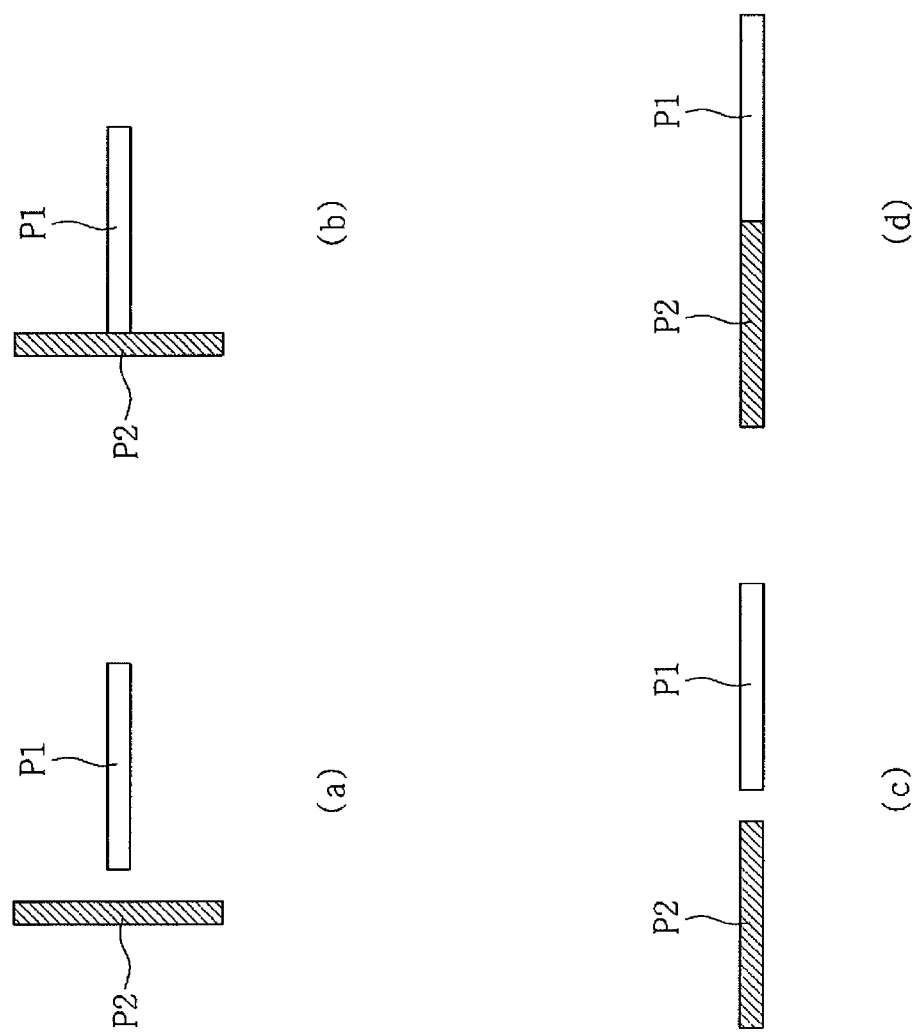
Figure 11D:
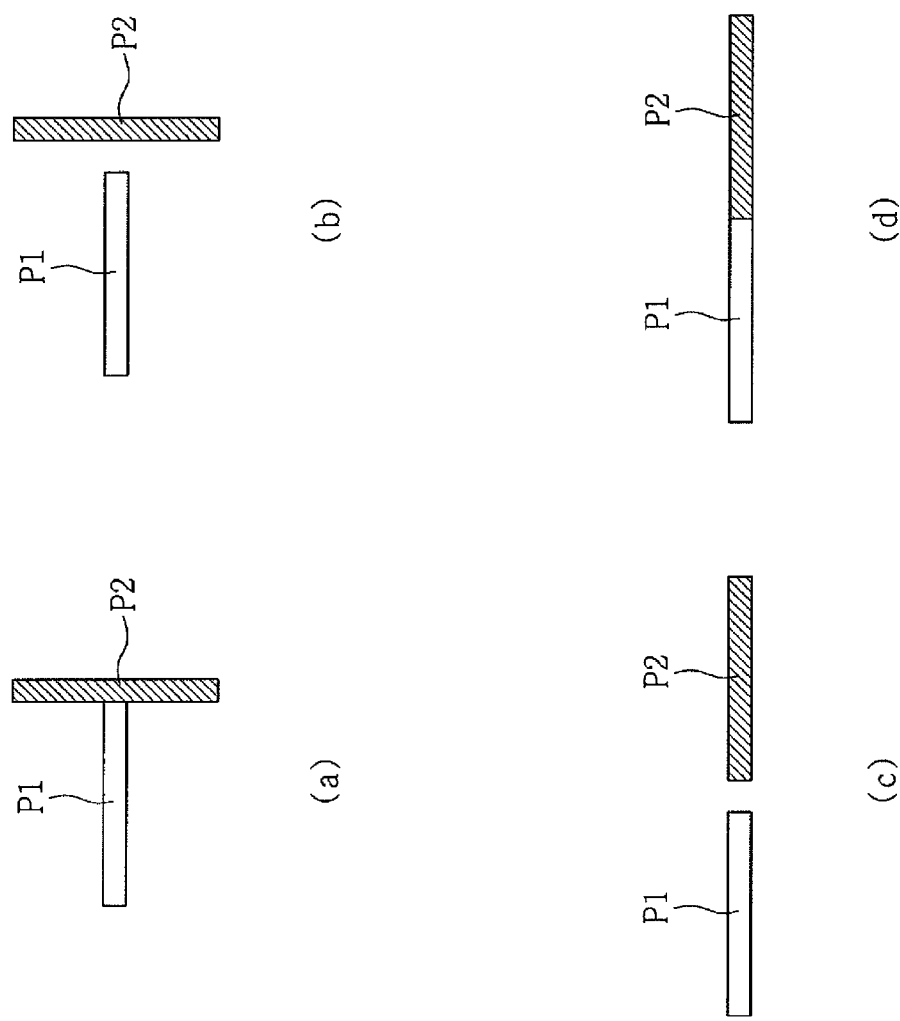

FIGS. 8A to 8D illustrate combinations in which the first polygon P1 and the second polygon P2 are generated and disposed in various ways, e.g., each test pattern may be a composite of the first and second polygons P1 and P2. For example, FIG. 8A illustrates the second polygon P2 disposed in the top region of the first polygon P1 in various ways, FIG. 8B illustrates the second polygon P2 disposed in the bottom region of the first polygon P1 in various ways, FIG. 8C illustrates the second polygon P2 disposed in the left region of the first polygon P1 in various ways, and FIG. 8D illustrates the second polygon P2 disposed in the right region of the first polygon P1 in various ways.

In detail, FIG. 8A(a) illustrates the second polygon P2 having the horizontal bar shape disposed to be separated from and in the top region of the first polygon P1, FIG. 8A(b) illustrates the second polygon P2 having the horizontal bar shape disposed to be merged with and in the top region of the first polygon P1, FIG. 8A(c) illustrates the second polygon P2 having the vertical bar shape disposed to be separated from and in the top region of the first polygon P1, and FIG. 8A(d) illustrates the second polygon P2 having the vertical bar shape disposed to be merged with and in the top region of the first polygon P1. FIG. 8B(a) to 8B(d) illustrate that the second polygon P2 having the horizontal/vertical bar shape is disposed to be separated or merged in the bottom region of the first polygon P1. FIG. 8C(a) to 8C(d) illustrate that the second polygon P2 having the horizontal/vertical bar shape is disposed to be separated or merged in the left region of the first polygon P1. FIG. 8D(a) to 8D(d) illustrate that the second polygon P2 having the horizontal/vertical bar shape is disposed to be separated or merged in the right region of the first polygon P1. In other embodiment, the first polygons P1 and the second polygons P2 may intersect or partially overlap.

Referring again to FIG. 1, the method may include checking whether the above processes are performed or not by the set number of iterations. When the above processes are performed by the set number of iterations, the method of generating the test patterns may end. When the above processes are not performed by the set number of iterations, the method may include repeating the above processes.

Referring to FIGS. 1 and 9, the method may include repeating the above processes. As an example, the processes described with reference to FIGS. 2-7 may be repeated, so a plurality of first polygons P1 and a plurality of second polygons P2 may be generated. For example, the plurality of the first polygons P1 and the second polygons P2 illustrated in FIGS. 8A to 8D may be disposed in various ways, as illustrated in FIG. 9.

In another example, as illustrated in FIG. 10, each test pattern may be a composite including more than two polygons. For example, as illustrated in FIG. 10, the generated polygons may intersect or overlap in various forms. For example, the polygons illustrated in FIGS. 8A to 8D, which are disposed in various ways, may be generated and disposed at random positions in various ways so as to abut, intersect, or partially overlap. All the polygons may be separated to have a greater space S than a minimum space by the design rule.

FIGS. 11A to 11D illustrate various forms in which the first polygon P1 and the second polygon P2 are generated and disposed when the first polygon P1 has the horizontal bar shape. Various combinations of the first polygons P1 and the second polygons P2 illustrated in FIGS. 11A to 11D may be understood with reference to FIGS. 8A to 8D.

Figure 12:
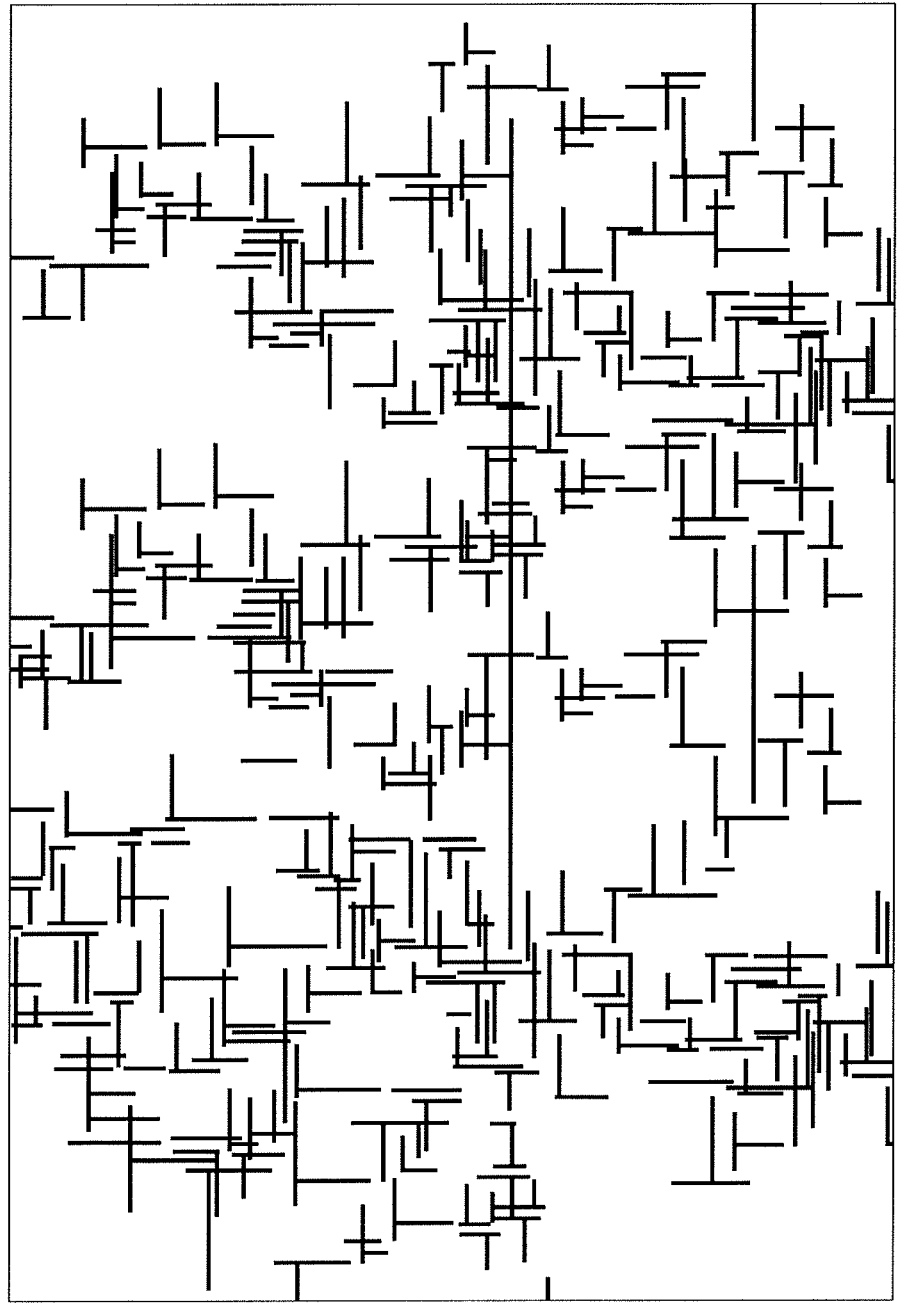
FIG. 12 illustrates a conceptual view of generated test patterns in accordance with an embodiment.

FIG. 12 is a conceptual view illustrating substantial test patterns generated by the method according to an embodiment. Referring to FIG. 12, according to an embodiment, test patterns having various combinations of the polygons randomly disposed in the pattern region A may be generated.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments described herein.

By way of summation and review, a minimum line width of a mask pattern may require an optical proximity effect correction (OPC) to provide a, e.g., circuit, pattern with a desired dimension. The OPC may be performed by computer simulations or repeated experiments, and test patterns for the OPC are used in the computer simulations or repeated experiments in order to determine differences (errors) between the mask patterns and the test patterns. However, since the circuit patterns used in the semiconductor devices may have very diverse and complex shapes, test patterns having simple linear shapes, e.g., one-dimensional or two-dimensional line-and-space type stripe patterns, may increase an error rate of the OPC calibration as the simulation progresses.

In contrast, embodiments increase the accuracy of the OPC calibration by using test patterns with complex shapes via a random pattern generating method, thereby reducing the difference (error) between the actually designed mask patterns and the test patterns for the OPC. That is, the test patterns in accordance with an embodiment and the method of generating the test patterns may be used to optimize a photolithography process for forming complex circuit patterns of semiconductor devices. In addition, the test patterns in accordance with an embodiment and the method of generating the test patterns may be useful in an optical proximity effect correction (OPC) technique. Further, the test patterns in accordance with an embodiment and the method of generating the test patterns may be useful in a design rule verification method for evaluating and determining the appropriateness of critical dimension and spaces. Finally, the test patterns in accordance with an embodiment and the method of generating the test patterns may be used to evaluate and determine the mutual influence of the coloring patterns and the appropriateness of the coloring in a pattern coloring method of a dual patterning process. However, effects of the embodiments are not limited to the above, and can include effects, which are predicted, are able to be predicted, or are reversely verified from the various embodiments.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   generating a first polygon;
   disposing the first polygon in a pattern region;
   selecting one region from peripheral regions of the first polygon;
   generating a second polygon;
   disposing the second polygon in the selected region;
   repeating generation and disposition of the first and second polygons to form mask patterns, such that the first and second polygons are disposed via a random function to have different orientations relatively to each other in the mask patterns; and
   manufacturing the semiconductor device by performing a photolithography process using the formed mask patterns as a photomask to form circuit patterns on a substrate.

2. The method as claimed in claim 1, wherein each of the first polygon and the second polygon has a vertical or horizontal bar shape having a rectangular shape.

3. The method as claimed in claim 2, wherein the first polygon and the second polygon have a same size.

4. The method as claimed in claim 1, wherein the first polygon is disposed in the pattern region using a random coordinate function.

5. The method as claimed in claim 1, wherein the peripheral regions of the first polygon include a top region, a bottom region, a left region, and a right region of the first polygon, such that the second polygon is disposed randomly in one of the top region, the bottom region, the left region, and the right region of the first polygon to have the first and second polygons in at least one pair of the first and second polygons in the mask patterns non-parallel to each other.

6. The method as claimed in claim 5, wherein the second polygon is disposed in the selected region in a vertical bar shape or a horizontal bar shape using a random direction function, such that in the at least one pair of the first and second polygons the second polygon is perpendicular to the first polygon.

7. The method as claimed in claim 1, wherein the first polygon and the second polygon are disposed within a set space.

8. The method as claimed in claim 1, wherein the first polygon and the second polygon are merged or separated through a random setting method.

9. The method as claimed in claim 1, further comprising:
   checking a space between the first polygon and the second polygon; and removing at least one of the first polygon and the second polygon when the space between the first polygon and the second polygon is smaller than a set minimum space.

10. The method as claimed in claim 1, wherein the first polygon and the second polygon generated by the repeating are allowed to intersect or contact each other.

11. A method of manufacturing a semiconductor device, the method comprising:
generating a first polygon;
disposing the first polygon in a pattern region;
randomly selecting one region from a top region, a bottom region, a left region, and a right region of the first polygon;
generating a second polygon;
disposing the second polygon in the selected region;
checking a space between the first polygon and the second polygon;
determining the first polygon and the second polygon as normal pass patterns when the space is greater than a set minimum space;
repeating the above processes to form mask patterns, such that the first and second polygons are disposed via a random function to have different orientations relatively to each other; and
manufacturing the semiconductor device by performing a photolithography process using the formed mask patterns as a photomask to form circuit patterns on a substrate.

12. The method as claimed in claim 11, wherein generating each of the first polygon and the second polygon includes selecting any one of a vertical bar shape and a horizontal bar shape using a random direction function.

13. The method as claimed in claim 11, wherein:
the first polygon is disposed at predetermined coordinates; and
the second polygon is randomly disposed in the region selected using a random position function in one shape of a vertical bar shape and a horizontal bar shape selected using a random direction function.

14. The method as claimed in claim 11, further comprising:
determining the first polygon and the second polygon as fail patterns when the checked space between the first polygon and the second polygon is smaller than the set minimum space; and
removing the first polygon and the second polygon.

15. The method as claimed in claim 11, wherein repeating the above processes includes disposing at least two first polygons and at least two second polygons to have at least two pairs of first and second polygons, such that an angle between the first and second polygons in a first pair of the at least two pairs is different from an angle between the first and second polygons in a second pair of the at least two pairs.

16. A method of manufacturing a semiconductor device, the method comprising:
generating test patterns, the generating of the test patterns embodied in an algorithm to be performed by a processor;
optimizing an optical proximity correction (OPC) model using the test patterns;
generating mask patterns using the optimized OPC model; and
performing a photolithography process using the mask patterns as a photomask to form circuit patterns on a substrate, such that the semiconductor device is formed,
wherein generating the test patterns includes:
generating a first polygon;
disposing the first polygon in a pattern region;
selecting one region from peripheral regions of the first polygon;
generating a second polygon;
disposing the second polygon in the selected region, such that the first and second polygons define at least a part of a composite of one test pattern of the test patterns; and
repeating generation and disposition of the first and second polygons to form the test patterns for the mask patterns, such that the first and second polygons are disposed via a random function to have different orientations relatively to each other in the mask patterns.

17. The method as claimed in claim 16, wherein disposing the second polygon in the selected region is within a predetermined range with respect to the first polygon.

18. The method as claimed in claim 16, wherein disposing the second polygon in the selected region is such that the first and second polygons are at non-oblique angles with respect to each other.

19. The method as claimed in claim 16, wherein selecting the one region from the peripheral regions is performed with a random function.

20. The method as claimed in claim 19, wherein disposing the second polygon in the selected region is random with respect to an angle between the first and second polygons.

* * * * *